US008879299B2

(12) United States Patent
Hou et al.

(10) Patent No.: US 8,879,299 B2
(45) Date of Patent: Nov. 4, 2014

(54) NON-VOLATILE MEMORY CELL CONTAINING AN IN-CELL RESISTOR

(75) Inventors: Kun Hou, Milpitas, CA (US); Yung-Tin Chen, Santa Clara, CA (US); Zhida Lan, San Jose, CA (US); Huiwen Xu, Sunnyvale, CA (US)

(73) Assignee: Sandisk 3D LLC, Milpitas, CA (US)

( * ) Notice: Subject to any disclaimer, the term of this patent is extended or adjusted under 35 U.S.C. 154(b) by 320 days.

(21) Appl. No.: 13/552,355

(22) Filed: Jul. 18, 2012

(65) Prior Publication Data

US 2013/0094278 A1    Apr. 18, 2013

Related U.S. Application Data

(60) Provisional application No. 61/547,819, filed on Oct. 17, 2011.

(51) Int. Cl.
| G11C 11/36 | (2006.01) |
| H01L 27/24 | (2006.01) |
| G11C 17/16 | (2006.01) |
| H01L 45/00 | (2006.01) |
| G11C 13/00 | (2006.01) |

(52) U.S. Cl.
CPC .......... G11C 13/0007 (2013.01); H01L 45/146 (2013.01); G11C 2213/72 (2013.01); H01L 45/04 (2013.01); G11C 2013/0073 (2013.01); H01L 27/2409 (2013.01); H01L 45/12 (2013.01); G11C 17/16 (2013.01); G11C 2213/71 (2013.01); G11C 13/0069 (2013.01); G11C 2213/51 (2013.01); G11C 2013/0083 (2013.01); H01L 45/1233 (2013.01); G11C 2213/32 (2013.01)

USPC .......................................... 365/115; 365/148

(58) Field of Classification Search
USPC ......................................... 365/115, 148, 100
See application file for complete search history.

(56) References Cited

U.S. PATENT DOCUMENTS

| 6,015,738 | A  | 1/2000  | Levy et al. |
| 7,285,464 | B2 | 10/2007 | Herner et al. |
| 7,579,232 | B1 | 8/2009  | Ping et al. |
| 7,701,746 | B2 | 4/2010  | Meeks et al. |
| 7,745,312 | B2 | 6/2010  | Herner et al. |
| 7,830,697 | B2 | 11/2010 | Herner et al. |
| 8,097,498 | B2 | 1/2012  | Purayath et al. |
| 2005/0052915 | A1 | 3/2005 | Herner et al. |
| 2005/0073010 | A1 | 4/2005 | Lai et al. |
| 2006/0245235 | A1* | 11/2006 | Krieger et al. ................ 365/115 |

(Continued)

FOREIGN PATENT DOCUMENTS

WO    WO2009/091786 A1    7/2009

OTHER PUBLICATIONS

U.S. Appl. No. 13/356,047, filed Jan. 23, 2012, James K. Kai et al., "Non-Volatile Memory Cell Containing a Nano-Rail Electrode," Specification and drawings, 52pgs.

(Continued)

Primary Examiner — Vu Le
(74) Attorney, Agent, or Firm — The Marbury Law Group PLLC

(57) ABSTRACT

A non-volatile memory cell includes a first electrode, a steering element, a metal oxide storage element located in series with the steering element, a dielectric resistor located in series with the steering element and the metal oxide storage element, and a second electrode.

21 Claims, 6 Drawing Sheets

(56) References Cited

U.S. PATENT DOCUMENTS

| | | |
|---|---|---|
| 2006/0246606 A1 | 11/2006 | Hsu et al. |
| 2006/0250836 A1 | 11/2006 | Herner et al. |
| 2006/0250837 A1 | 11/2006 | Herner et al. |
| 2006/0292301 A1 | 12/2006 | Herner |
| 2007/0072360 A1 | 3/2007 | Kumar et al. |
| 2007/0236981 A1 | 10/2007 | Herner |
| 2008/0254576 A1 | 10/2008 | Hsia et al. |
| 2009/0086521 A1 | 4/2009 | Herner |
| 2009/0179310 A1 | 7/2009 | Dunton et al. |
| 2009/0256129 A1 | 10/2009 | Scheuerlein |
| 2010/0258782 A1* | 10/2010 | Kuse et al. .................. 257/4 |
| 2011/0183475 A1 | 7/2011 | Purayath et al. |
| 2011/0227024 A1 | 9/2011 | Sekar |

OTHER PUBLICATIONS

PCT/US2011/022400, International Search Report & Written Opinion, Apr. 8, 2011, 12pgs.

D. H. Im et al., "A Unified 7.5nm Dash-Type Confined Cell for High Performance PRAM Device," IEEE Electron Devices Meeting, Dec. 15-17, 2008, pp. 1-4.

M. J. Kim et al., "Low Power Operating Bipolar TMO ReRAM for Sub 10 nm Era," IEEE Electron Devices Meeting, Dec. 6-8, 2010, 4pgs.

Zurich News, "IBM Scientists Demonstrate Computer Memory Breakthrough," Jun. 30, 2011, 2pgs.

Dennison, C., "Phase Change Memory: Status and Challenges to Navigate an Increasingly Competitive Memory Landscape," Ovonyx, Inc., Oct. 14, 2009, pp. 1-58.

International Search Report and Written Opinion issued in International Application No. PCT/US2012/048232 dated Nov. 21, 2012.

International Preliminary Report on Patentability received in connection with International application No. PCT/US2012/048232: mailed May 1, 2014.

* cited by examiner

NON-VOLATILE MEMORY CELL CONTAINING AN IN-CELL RESISTOR

BACKGROUND OF THE INVENTION

This application claims the benefit of priority to U.S. Provisional Application No. 61/547,819, filed on Oct. 17, 2011, the entire contents of which are incorporated herein by reference.

The invention relates to non-volatile memory devices and methods of making thereof.

Non-volatile memory arrays maintain their data even when power to the device is turned off. In one-time programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

SUMMARY OF THE EMBODIMENTS

One embodiment of the invention provides a non-volatile memory cell which includes a first electrode, a steering element, a metal oxide storage element located in series with the steering element, a dielectric resistor located in series with the steering element and the metal oxide storage element, and a second electrode.

Another embodiment of the invention provides a method of operating the non-volatile memory cell which includes providing a forming programming voltage or current to the memory cell between the first and the second electrodes such that at least one electrically conductive filament is formed through the metal oxide storage element, to switch the metal oxide storage element from a higher resistivity state to a lower resistivity state. No conductive filament is formed through the dielectric resistor during the forming programming step such that a resistivity of the dielectric resistor is substantially unchanged after the forming programming step, and substantially no transient current flows through the memory cell during the forming programming step.

DETAILED DESCRIPTION OF THE PREFERRED EMBODIMENTS

Figure 1:
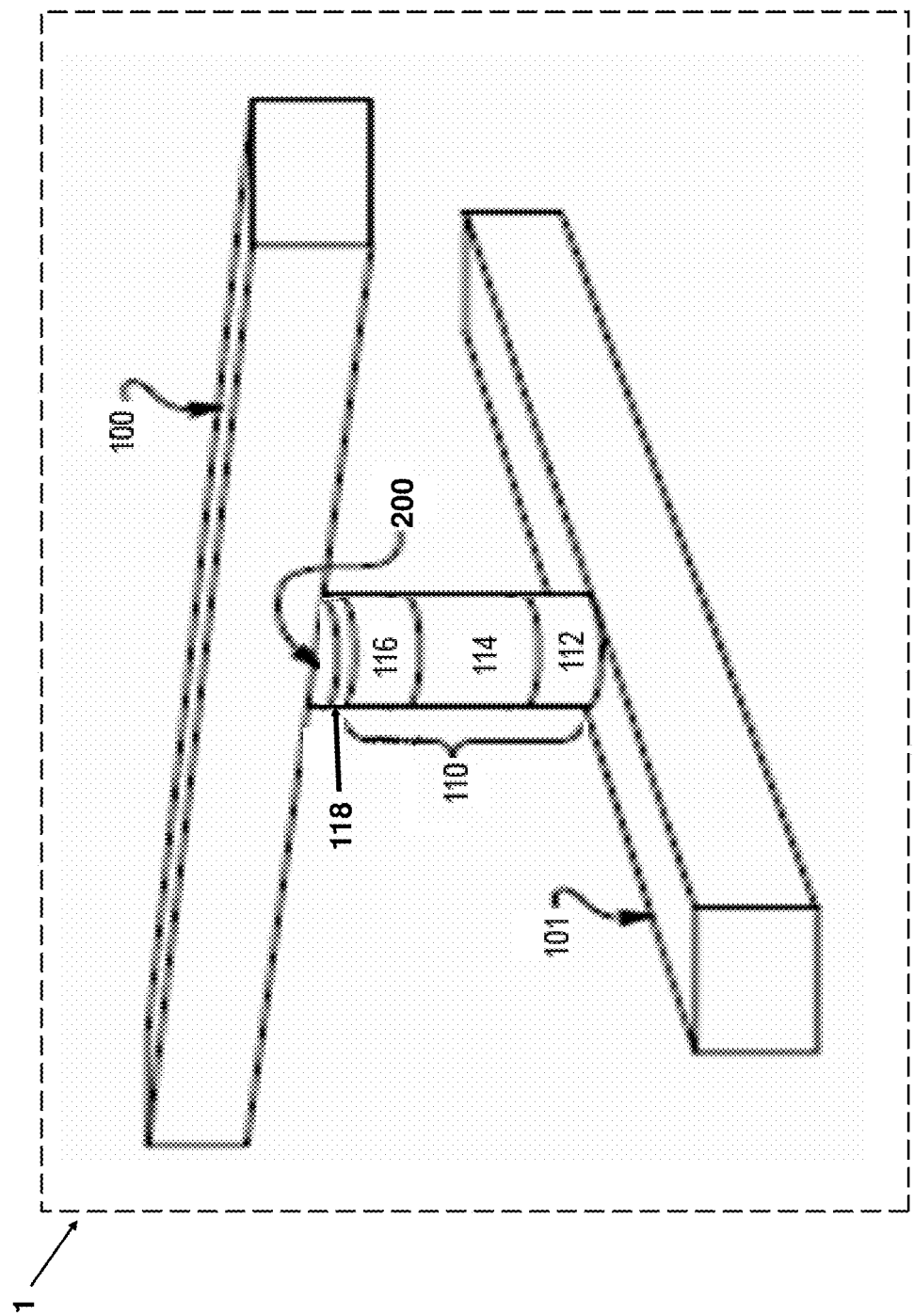
FIG. 1 is a perspective view of a non-volatile memory cell of one embodiment.

In general, a memory cell comprises a storage element and a steering element. For example, FIG. 1 illustrates a perspective view of a memory cell 1 of one embodiment.

The cell 1 includes a first electrode 101 and a second electrode 100 are formed of a conductive material, which can independently comprise any one or more suitable conducting material known in the art, such as tungsten, copper, aluminum, tantalum, titanium, cobalt, titanium nitride or alloys thereof. For example, in some embodiments, tungsten is preferred to allow processing under a relatively high temperature. In some other embodiments, copper or aluminum is a preferred material. The first electrode 101 (e.g., word line) extends in a first direction while the second electrode 100 (e.g., bit line) (extends in a second direction different from the first direction. Barrier and adhesion layers, such as TiN layers, may be included in the first (e.g., the bottom) electrode 101 and/or the second (e.g., the top) electrode 100.

The steering element 110 can be a transistor or a diode. If the steering element 110 is a diode, the storage element can be arranged vertically and/or horizontally and/or patterned to form a pillar or block having a substantially cylindrical shape. In one embodiment, as shown in FIG. 1, the steering element 110 is a semiconductor diode arranged vertically and having a bottom heavily doped p-type region 112, an optional intrinsic region 114, which is not intentionally doped, and a top heavily doped n-type region 116, though the orientation of this diode may be reversed. Such a diode, regardless of its orientation, will be referred to as a p-i-n diode or simply diode. The diode can comprise any single crystal, polycrystalline, or amorphous semiconductor material, for example silicon, germanium, silicon germanium, or other compound semiconductor materials, such as III-V, II-VI, etc. materials. For example, a p-i-n polysilicon diode 110 may be used.

A storage element 118 is disposed in series with the steering element 110, either over the top region 116 or below the bottom region 112 of the steering element 110. The storage element 118 may be a resistivity switching element. For example, the storage element may comprise a metal oxide switchable material layer selected from NiO, $Nb_2O_5$, $TiO_2$, $HfO_2$, $Al_2O_3$, $MgO_x$, $CrO_2$, VO or combination thereof.

In preferred embodiments of this invention, a dielectric resistor 200 is located in series with the steering element 110 and the metal oxide storage element 118 between the top electrode 100 and the bottom electrode 101. The dielectric resistor 200 preferably comprises an electrically insulating material layer. For example, the electrically insulating material layer may comprise a silicon nitride or silicon oxynitride layer having a thickness of about 1 to about 10 nm, such as 1 to 2 nm. The silicon nitride layer may comprise stoichiometric silicon nitride (i.e., $Si_3N_4$) or non-stoichiometric silicon nitride (e.g., $Si_3N_{4\pm x}$, where x preferably ranges between 0.001 and 1).

Without wishing to be bound by a particular theory, it is believed that the resistor 200 in the memory cell reduces or eliminates a high transient current that is believed to originate from the large size conductive filaments developed in the metal oxide storage material during the initial forming (e.g., cell programming) process. These filaments may lead to subsequent high current operation of the cell. The in-cell resistor 200 is believed to provide in-cell resistance management or tuning during the forming process and to provide subsequent lower current (e.g., less than 1 micro-ampere) operation (e.g., low read current operation) of the programmed ReRAM cell. It is believed that the tuning of the cell resistance allows smaller size filament formation in the metal oxide layer(s) to achieve the low current cell operation without sacrificing good data retention. Furthermore, while the dielectric layer 200 is described as a resistor, it may function as a capacitor or a combination of a resistor and capacitor to reduce the size of the filaments and allow lower current cell operation.

Without wishing to be bound by a particular theory, at least one electrically conductive filament (and typically plural filaments) are formed through the metal oxide storage element or layer(s) 118 during a forming programming of the memory cell to switch the metal oxide storage element from its initial, as-formed, higher resistivity state to a lower resistivity state. However, it is believed that no conductive filament is formed through the dielectric resistor 200 during the forming programming of the memory cell, such that a resistivity of the dielectric resistor 200 is substantially unchanged after the forming programming of the memory cell. As a result, substantially no transient current flows through the memory cell during the forming programming of the memory cell. In other words, no detectable transient current which can be detected with typical current measurement tools (e.g., tools having a sensitivity of 100 micro-amperes or higher) flows through the memory cell.

After the initial forming programming step, the memory cell may be read and/or further programmed. For example, reset programming voltage or current may be applied to the memory cell between the upper 100 and lower 101 electrodes to switch the metal oxide storage element 118 from the lower resistivity state (e.g., the post-forming state or a "set" state) to a higher resistivity state (e.g., reset state). It is believed that the at least one electrically conductive filament no longer extends through the entire metal oxide storage element. In other words, the tip of the filament ends somewhere in the metal oxide element or layer(s) 118 and the filament does not extend to the next electrically conductive layer or doped semiconductor layer of the cell, and preferably does not extend into the resistor element 200. In another example, a set programming voltage or current is applied to the memory cell between the electrodes 100, 101 to switch the metal oxide storage element from the higher "reset" resistivity state to the lower "set" resistivity state. It is believed that the set programming pulse causes the electrically conductive filament to extend through the entire metal oxide storage element (e.g., the filament grows longer to span the entire metal oxide element or layer 118 thickness).

Preferably, the forming programming step comprises applying a forward bias (e.g., positive voltage) to flow a direct current between the electrodes 100, 101. Preferably, the set programming step comprises applying a negative voltage (e.g., reverse bias) between the electrodes to flow an alternating current through the memory cell, and the reset programming step comprises applying a positive voltage (e.g., a forward bias) between the electrodes to flow an alternating current through the memory cell.

Figure 2A:
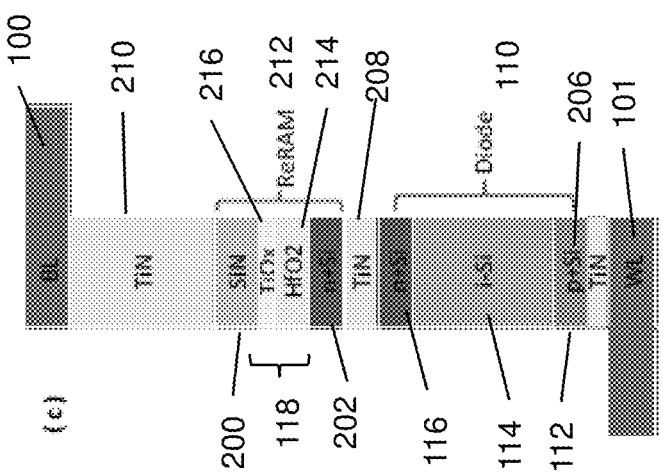
FIGS. 2A, 2B and 2C are side cross-sectional views schematically illustrating non-volatile memory cells of embodiments of the invention.
Figure 2B:
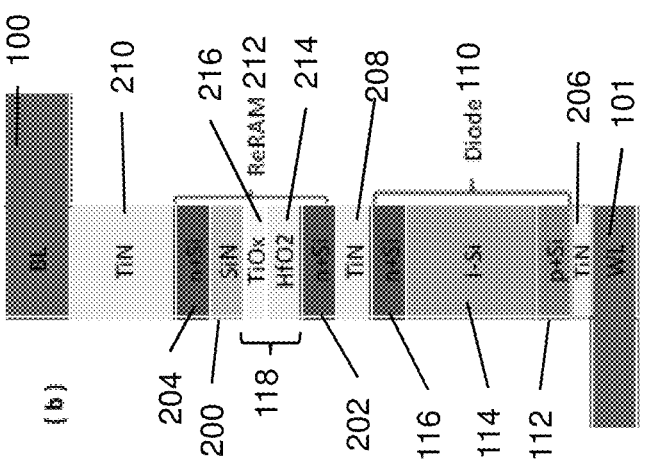
Figure 2C:
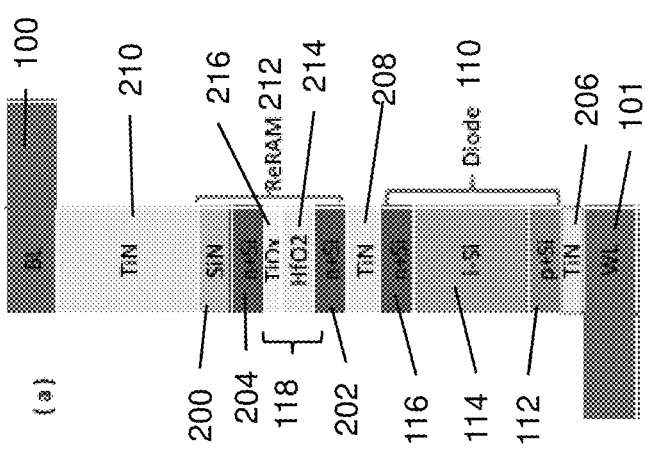

FIGS. 2A, 2B and 2C are side cross-sectional views schematically illustrating non-volatile memory cells of embodiments of the invention. Preferably, the memory cell 1 includes at least one heavily doped semiconductor layer 202, 204 located in series with the steering element 110, the metal oxide storage element 118 and the dielectric resistor 200. For diode steering element 110 having an n-type region 116 facing the storage element, preferably the at least one heavily doped semiconductor layer 202, 204 comprises n-type silicon, such as n+ doped polysilicon having an n+ dopant concentration (e.g., P or As concentration) of $5 \times 10^{18}$ to $2 \times 10^{21}$ cm$^{-3}$.

For example, as shown in FIG. 2A, the memory cell 1 may include a first n+ polysilicon layer 202 located between the n+ region 116 of the diode 110 and the storage element 118. The memory cell 1 may also include a second n+ polysilicon layer 204 located between the storage element 118 and the resistor 200. Alternatively, as shown in FIG. 2B, the second n+ polysilicon layer 204 may be located between the resistor 200 and the upper electrode 110, while the resistor 200 is located directly on top of the storage element 118. In another alternative configuration shown in FIG. 2C, the second n+ polysilicon layer 204 is omitted.

If the silicon nitride resistor 200 is formed on the first polysilicon layer 202, then the resistor may be formed by nitriding the polysilicon layer in a nitrogen containing ambient at an elevated temperature. For example, the resistor 200 may be formed by annealing the exposed polysilicon layer 202 in ammonia or another nitrogen containing ambient (e.g., N$_2$O, etc.) at a temperature above 600 C, such as 650 to 800 C, for example, 700 to 750C for 30 to 300 seconds, for example 60 to 90 seconds. Alternatively, the resistor layer 200 may be formed on the polysilicon layer 202 or any other underlying layer by physical or chemical vapor deposition (e.g., sputtering, atomic layer deposition, plasma enhanced CVD, etc.).

The memory cell may also include one or more optional conductive barrier layers 206, 208 and 210, such as titanium nitride or other similar layers. These barrier layers 206, 208 and 210 may be disposed between the bottom electrode 101 and the diode 110, and/or between the diode 110 and the storage element 118 and/or between the "ReRAM" element 212 and the upper electrode 100, respectively. The ReRAM element 212 may include the doped semiconductor layer(s) 202, 204, the storage element 118 and the resistor 200.

In one non-limiting embodiment, the metal oxide storage element 118 comprises a TiO$_x$ layer 216 and HfO$_2$ layer 214 stack. Preferably, the TiO$_x$ layer 216 is located closer to the dielectric resistor 200 than the HfO$_2$ layer 214, and the HfO$_2$ layer 214 is located closer to the diode 110 than the TiO$_x$ layer 216. In other words, for a cell shown in FIGS. 2A-2C with the ReRAM element 212 above the diode steering element 110, the TiO$_x$ layer 216 is located on the HfO$_2$ layer 214. In this configuration, it is believed that the TiO$_x$ layer 216 acts as a buffer which prevents the conductive filaments from propagating from the metal oxide storage element 118 into the dielectric resistor 200 during a forming programming of the memory cell. However, the filaments traverse the entire thickness of the metal oxide layers 214 and 216, but stop short of traversing the thickness of the resistor 200.

Thus, as shown in FIGS. 2A-2C, the steering element 110 is located above the lower electrode 101, the ReRAM element 212 including the metal oxide storage element 118, the dielectric resistor 200 and the heavily doped semiconductor layer(s) 202, 204 is located in a pillar above the steering element 110, and the upper electrode 100 is located above the pillar. In addition, as shown in FIG. 2A, a titanium nitride barrier layer 208 is located above the steering element 110, the first heavily doped semiconductor layer 202 is located above the titanium nitride barrier layer 208, the metal oxide storage element 118 is located above the first heavily doped semiconductor layer 202, the second heavily doped semiconductor layer 204 is located above the metal oxide storage element, and the dielectric resistor 200 is located above the second heavily doped semiconductor layer 204. In contrast, in FIG. 2B, the order of the layers is the same except that the order of layers 200 and 204 is reversed, such that the dielectric resistor 200 is located above (e.g., directly on) the metal oxide storage element 118 and the second heavily doped semiconductor layer 204 is located above (e.g., directly on) the dielectric resistor 200. Alternatively, as noted above, layer 204 may be omitted such that the dielectric resistor 200 is located above (e.g., directly on) the metal oxide storage element 118 without an overlying semiconductor layer 204.

In the above described configuration, the resistor layer 200 is located above the storage element 118. Of course, other configurations (not shown) may also be formed, for example where the resistor layer 200 is located below the storage element 118. The resistor layer 200 may be formed between the steering element 110 and the storage element 118, rather than between the storage element 118 and the electrode 100, as described above. In this configuration, the steering element 110 may be located either above or below the storage element 118 with the layer 200 located in between elements 110 and 118. Furthermore, the positions of the storage 118 and ReRAM elements 212 may be reversed in the pillar, such that the ReRAM element 212 including the metal oxide storage element 118, the dielectric resistor 200 and one or more heavily doped semiconductor layer(s) 202, 204 are located in the pillar above the lower electrode 101, the steering element 110 is located above the ReRAM element 212 in the pillar, and the upper electrode 100 is located above the steering element 110.

In preferred embodiments, the memory cell 1 includes a cylindrical vertical pillar containing steering element 110, storage element 118 and resistor 200, as shown in FIG. 1. However, the steering element 110, storage element 118 and resistor 200 may have a shape other than cylindrical, such as rail shaped, and/or may be provided in a horizontal configuration rather than in a vertical pillar if desired. For a detailed description of a design of a memory cell, see for example U.S. patent application Ser. No. 11/125,939 filed on May 9, 2005 (which corresponds to US Published Application No. 2006/0250836 to Herner et al.), and U.S. patent application Ser. No 11/395,995 filed on Mar. 31, 2006 (which corresponds to US Patent Published Application No. 2006/0250837 to Herner et al.,), each of which is hereby incorporated by reference.

The memory cell 1 can be a read/write memory cell or a rewritable memory cell.

The methods of forming one device level have been explained above. Additional memory levels can be formed above or below the memory level described above to form a monolithic three dimensional memory array having more than one device level.

Figure 3A:
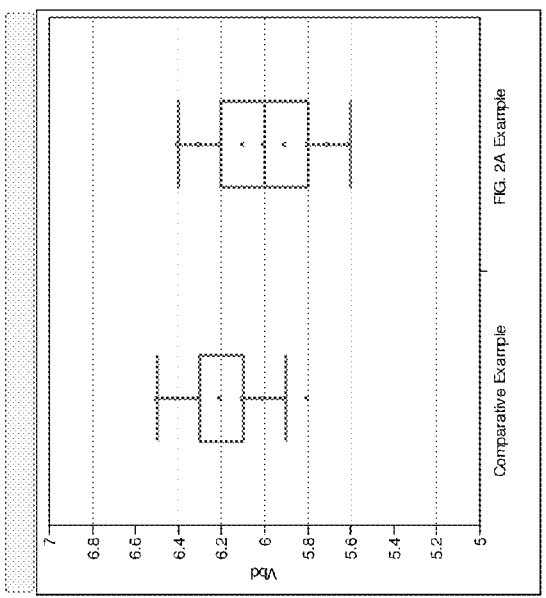
FIG. 3A is a box plot of forming voltage for a device according to a comparative example and for a device according to an embodiment of the invention illustrated in FIG. 2A.
Figure 3B:
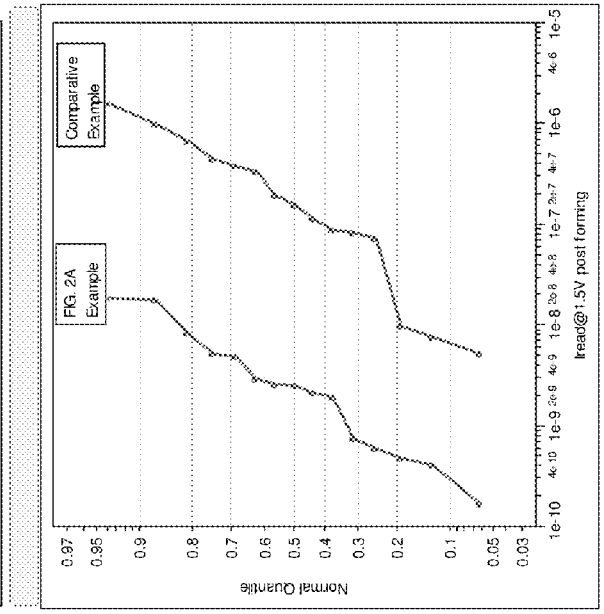
FIG. 3B is a probability plot of normal quantile versus read current for the device according to the comparative example and for the device according to an embodiment of the invention illustrated in FIG. 2A.

FIGS. 3A and 3B compare the performance of the exemplary device shown in FIG. 2A to a device of a comparative example. The devices had a 150 nm pillar critical dimension and an additional 11 kΩ on-chip resistor. The device of the comparative example is similar to the exemplary device, except that it lacks the resistor 200 and the doped semiconductor layer 204. The forming and reset operations were conducted in forward bias, and the set operation was conducted in reverse bias. The resistor layer 200 comprises a $SiN_x$ layer made by annealing the n+ polysilicon layer 204 in ammonia environment for 60 seconds at 700° C. The thickness of $SiN_x$ layer is approximately 1.7 nm.

FIG. 3A illustrates that the forming voltage ($V_{bd}$) applied during the forming step was comparable for both devices, despite the presence of extra layers in the exemplary device compared to the device of the comparative example. FIG. 3B illustrates the post-forming cell read currents (IFU) at 1.5V. The read current was about 2.5 nA for the exemplary device and about 50 nA for the comparative example devices. The lower read current of the exemplary device suggests the formation of smaller size filaments as compared to the device of the comparative example during the forming process.

Figure 4A:
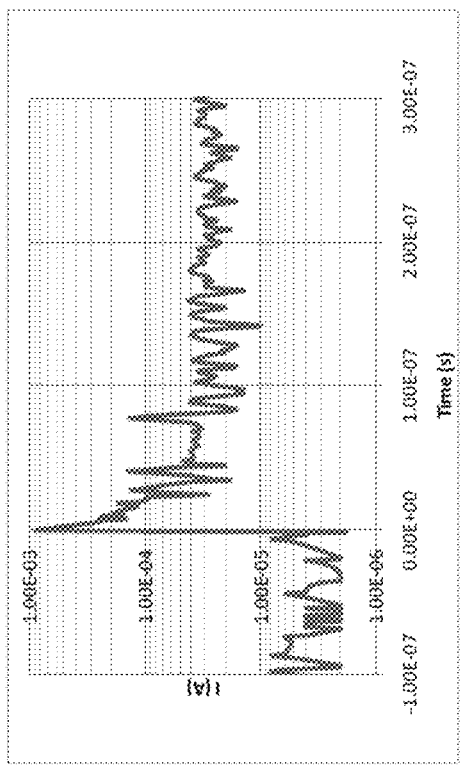
FIGS. 4A and 4B are respective plots of forming current versus time for a device according to a comparative example and for a device according to an embodiment of the invention illustrated in FIG. 2A, respectively.
Figure 4B:
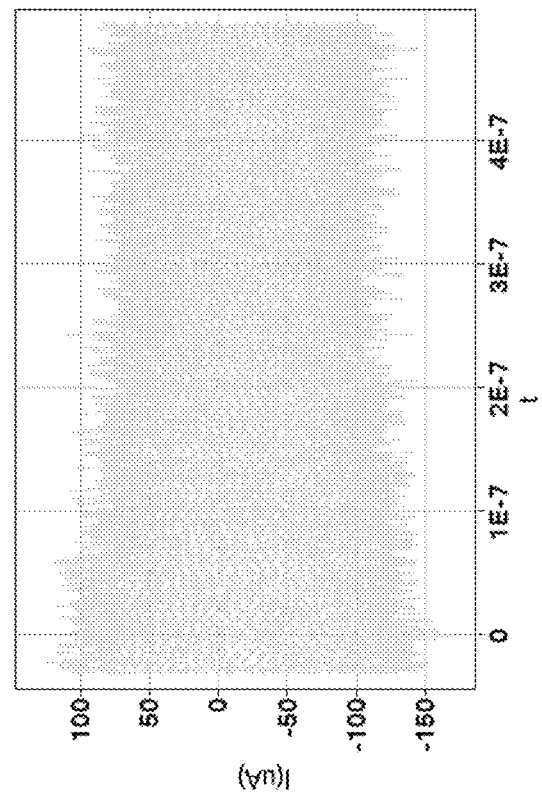

FIGS. 4A and 4B compare the current during the forming step of the exemplary device shown in FIG. 2A to a device of a comparative example. The devices had a 150 nm pillar critical dimension and an additional 16 kΩ on-chip resistor. FIG. 4A illustrates the plot of transient current versus time for the device of a comparative example. As can be seen, a transient current of about 860 micro-amperes was measured during the forming step. FIG. 4B illustrates the plot of transient current versus time for the exemplary device. As can be seen, only noise was measured and no transient current was detected. Thus, the current was lower than the 100 micro-amp lower limit of the measurement device. Therefore, either no transient current or a transient current below 100 micro-amperes is present in the exemplary device. This implies that significantly smaller filaments are formed in the exemplary device than in the device of the comparative example.

Figures 5A, 5B, 5C:
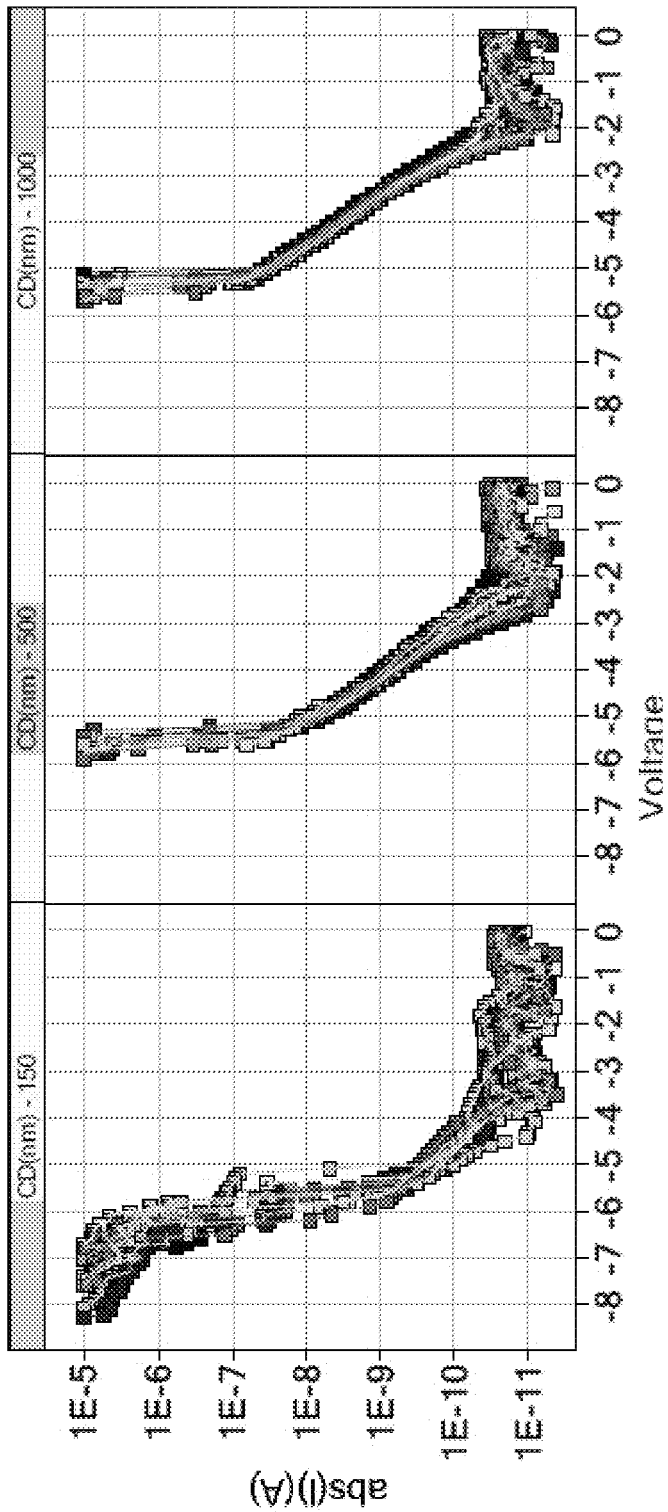
FIGS. 5A-5C are plots of current versus voltage for the device according to an embodiment of the invention illustrated in FIG. 2A.

FIGS. 5A, 5B and 5C illustrate the plots of current versus voltage of the exemplary cells having respective pillar critical dimensions of 150 nm, 500 nm, and 1000 nm, respectively. Each memory cell was a single memory cell formed on a separate wafer with a 500Ω on-chip resistor. No detectable transient currents (above the 100 micro-amp measurement device limit) were measured in any of the cells even with the low resistance on-chip resistor and even in the cell with the relatively large 1000 nm critical dimension. The result implies that the $SiN_x$ resistor layer is serving as in-cell resistor during the forming process.

Figure 6:
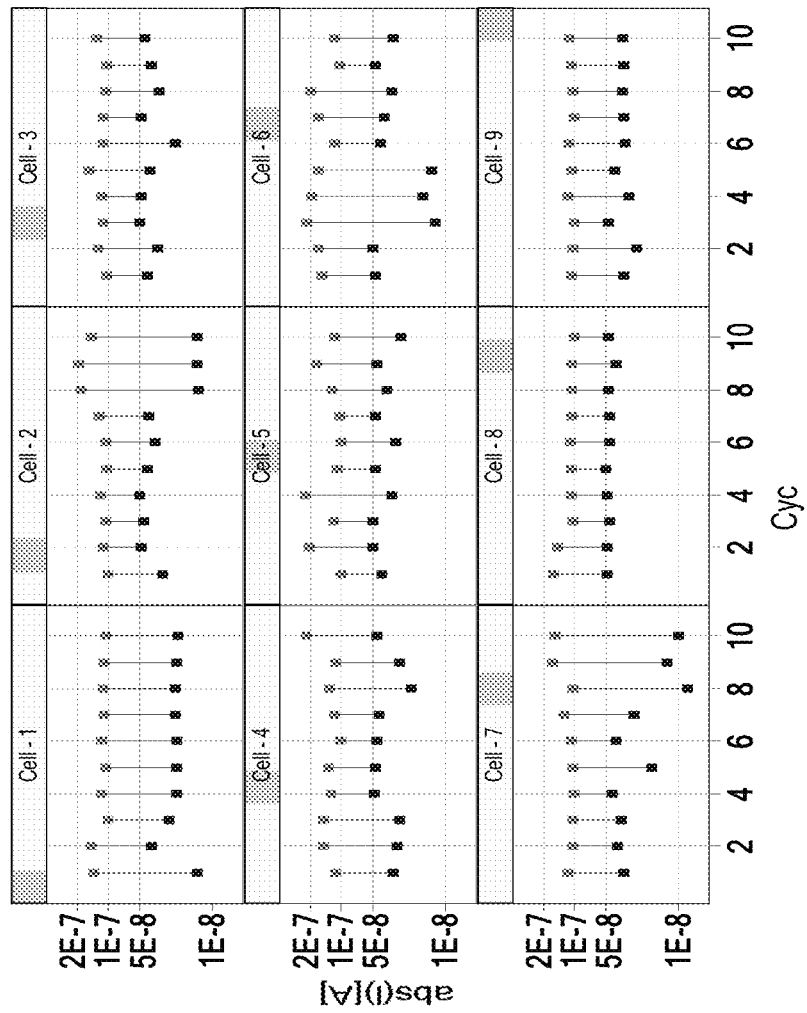
FIG. 6 is a box plot of absolute current for nine cells according to an embodiment of the invention illustrated in FIG. 2A.

FIG. 6 is a box plot of absolute current after ten set and reset operations on nine cells having a structure according to an embodiment of the invention illustrated in FIG. 2A. Each of the nine cells was a single memory cell formed on a separate wafer with a 9 kΩ on-chip resistor and a critical pillar dimension of 150 nm. The results show that the cell read currents after set and reset operations are in the order of tens of nano amperes. In general, the "on" read current after the set operation varies between about $1 \times 10^{-7}$ and about $2.1 \times 10^{-7}$ amperes for each of the tested cells over the ten set cycles. In general, the "off" read current after the reset operation varies between about $1 \times 10^{-8}$ and about $5 \times 10^{-8}$ amperes for each of the tested cells over the ten set cycles (except for reset cycle 8 of cell 7 having a current slightly below $1 \times 10^{-8}$ amperes). This read stability suggests potential good data retention of the exemplary device.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A non-volatile memory cell, comprising:
a first electrode;
a steering element;
a metal oxide storage element located in series with the steering element;
a dielectric resistor located in series with the steering element and the metal oxide storage element; and
a second electrode.

2. The non-volatile memory cell of claim 1, wherein the dielectric resistor comprises an electrically insulating material layer.

3. The non-volatile memory cell of claim 2, wherein the electrically insulating material layer comprises a silicon nitride or silicon oxynitride layer having a thickness of about 1 to about 10 nm.

4. The non-volatile memory cell of claim 2, wherein:
at least one electrically conductive filament is formed through the metal oxide storage element during a forming programming of the memory cell to switch the metal oxide storage element from a higher resistivity state to a lower resistivity state;
no conductive filament is formed through the dielectric resistor during the forming programming of the memory cell such that a resistivity of the dielectric resistor is substantially unchanged after the forming programming of the memory cell; and
substantially no transient current flows through the memory cell during the forming programming of the memory cell.

5. The non-volatile memory cell of claim 2, further comprising at least one heavily doped semiconductor layer located in series with the steering element, the metal oxide storage element and the dielectric resistor.

6. The non-volatile memory cell of claim 5, wherein the steering element comprises a diode or a transistor, and the metal oxide storage element comprises at least one metal oxide storage layer selected from NiO, $Nb_2O_5$, $TiO_x$, $HfO_2$, $Al_2O_3$, $MgO_x$, $CrO_2$, or VO layers.

7. The non-volatile memory cell of claim 6, wherein:
the steering element comprises a p-i-n polysilicon diode;
the at least one heavily doped semiconductor layer comprises an n-type polysilicon layer which faces an n-type portion of the p-i-n polysilicon diode; and
the metal oxide storage element comprises a $TiO_x$ layer and $HfO_2$ layer stack.

8. The non-volatile memory cell of claim 7, wherein:
the $TiO_x$ layer is located closer to the dielectric resistor than the $HfO_2$ layer such that the $TiO_x$ layer acts as a buffer which prevents conductive filaments from propagating from the metal oxide storage element into the dielectric resistor during a forming programming of the memory cell; and
the $HfO_2$ layer is located closer to the diode than the $TiO_x$ layer.

9. The non-volatile memory cell of claim 6, wherein:
the steering element is located above the first electrode;
the metal oxide storage element, the dielectric resistor and the heavily doped semiconductor layer are located in a pillar above the steering element; and
the second electrode is located above the pillar.

10. The non-volatile memory cell of claim 9, wherein:
a titanium nitride layer is located above the steering element;
the heavily doped semiconductor layer is located above the titanium nitride layer;
the metal oxide storage element is located above the heavily doped semiconductor layer;
a second heavily doped semiconductor layer is located above the metal oxide storage element; and
the dielectric resistor is located above the second heavily doped semiconductor layer.

11. The non-volatile memory cell of claim 9, wherein:
a titanium nitride layer is located above the steering element;
the heavily doped semiconductor layer is located above the titanium nitride layer;
the metal oxide storage element is located above the heavily doped semiconductor layer;
the dielectric resistor is located above the metal oxide storage element; and
a second heavily doped semiconductor layer is located above the dielectric resistor.

12. The non-volatile memory cell of claim 9, wherein:
a titanium nitride layer is located above the steering element;
the heavily doped semiconductor layer is located above the titanium nitride layer;
the metal oxide storage element is located above the heavily doped semiconductor layer; and
the dielectric resistor is located above the metal oxide storage element.

13. The non-volatile memory cell of claim 6, wherein:
the metal oxide storage element, the dielectric resistor and the heavily doped semiconductor layer are located in a pillar above the first electrode;
the steering element is located above the pillar; and
the second electrode is located above the steering element.

14. The non-volatile memory cell of claim 1, wherein the non-volatile memory cell is a rewritable memory cell; and
the non-volatile memory cell is located in a monolithic three dimensional array of memory cells.

15. A method of operating a non-volatile memory cell comprising a first electrode, a steering element, a metal oxide storage element located in series with the steering element, a dielectric resistor located in series with the steering element and the metal oxide storage element, and a second electrode, the method comprising:
providing a forming programming voltage or current to the memory cell between the first and the second electrodes such that at least one electrically conductive filament is formed through the metal oxide storage element, to switch the metal oxide storage element from a higher resistivity state to a lower resistivity state;
wherein no conductive filament is formed through the dielectric resistor during the forming programming step such that a resistivity of the dielectric resistor is substantially unchanged after the forming programming step; and
wherein substantially no transient current flows through the memory cell during the forming programming step.

16. The method of claim 15, further comprising:
providing a reset programming voltage or current to the memory cell between the first and the second electrodes such that the at least one electrically conductive filament no longer extends through the entire metal oxide storage element, to switch the metal oxide storage element from the lower resistivity state to a higher resistivity state; and
providing a set programming voltage or current to the memory cell between the first and the second electrodes such that the at least one electrically conductive filament extends through the entire metal oxide storage element, to switch the metal oxide storage element from the higher resistivity state to a lower resistivity state.

17. The method of claim 16, wherein:
the forming programming step comprises flowing a direct current between the first and the second electrodes;
the set programming step comprises applying a negative voltage between the first and the second electrodes to flow an alternating current through the memory cell; and
the reset programming step comprises applying a positive voltage between the first and the second electrodes to flow an alternating current through the memory cell.

18. The method of claim 15, wherein:
the steering element comprises a p-i-n polysilicon diode;
the metal oxide storage element comprises a $TiO_x$ layer and $HfO_2$ layer stack;
the $TiO_x$ layer is located closer to the dielectric resistor than the $HfO_2$ layer such that the $TiO_x$ layer acts as a buffer which prevents the at least one conductive filament from propagating from the metal oxide storage element into the dielectric resistor during the forming programming step; and
the $HfO_2$ layer is located closer to the diode than the $TiO_x$ layer.

19. The method claim 18, further comprising at least one heavily doped semiconductor layer located in series with the steering element, the metal oxide storage element and the dielectric resistor.

20. The method of claim 19, wherein the dielectric resistor comprises a silicon nitride or silicon oxynitride layer having a thickness of about 1 to about 10 nm.

21. The method of claim 20, wherein the at least one heavily doped semiconductor layer comprises a heavily doped polysilicon layer, and the dielectric resistor comprises the silicon nitride layer formed nitriding the polysilicon layer in a nitrogen containing ambient at an elevated temperature.

* * * * *